(12) United States Patent
Avelar Araujo et al.

(10) Patent No.: US 11,143,302 B2
(45) Date of Patent: Oct. 12, 2021

(54) SLIDING ELEMENT FOR INTERNAL COMBUSTION ENGINES

(71) Applicants: Mahle Metal Leve S/A, Jundiai (BR); Mahle International GmbH, Stuttgart (DE)

(72) Inventors: Juliano Avelar Araujo, Jundiai (BR); Paulo Jose Da Rocha Mordente, Jundiai (BR)

(73) Assignees: Mahle Metal Leve S/A; Mahle International GmbH

( * ) Notice: Subject to any disclaimer, the term of this patent is extended or adjusted under 35 U.S.C. 154(b) by 0 days.

(21) Appl. No.: 16/314,385

(22) PCT Filed: Jun. 27, 2017

(86) PCT No.: PCT/EP2017/065888
§ 371 (c)(1),
(2) Date: Dec. 28, 2018

(87) PCT Pub. No.: WO2018/002072
PCT Pub. Date: Jan. 4, 2018

(65) Prior Publication Data
US 2019/0154153 A1    May 23, 2019

(30) Foreign Application Priority Data
Jun. 30, 2016  (BR) .............. 10 2016 015392 1

(51) Int. Cl.
*F02F 3/00* (2006.01)
*F16J 9/28* (2006.01)
(Continued)

(52) U.S. Cl.
CPC .............. *F16J 9/28* (2013.01); *C23C 14/024* (2013.01); *C23C 14/025* (2013.01);
(Continued)

(58) Field of Classification Search
CPC ... F16J 9/28; F16J 9/26; C23C 14/024; C23C 14/025; C23C 14/0605; C23C 14/16; C23C 14/325; C23C 14/3407
(Continued)

(56) References Cited

U.S. PATENT DOCUMENTS 4,826,181 A  *  5/1989  Howard ................... F16J 15/20
                                                      277/539
6,325,385 B1 * 12/2001  Iwashita ................... F16J 9/26
                                                      277/442
(Continued)

FOREIGN PATENT DOCUMENTS

CN         103608482 A      2/2014
CN         104204272        12/2014
(Continued)

OTHER PUBLICATIONS

Nanoshel, Application of Graphite Nanoparticles, Mar. 3, 2016, Nanoshel, p. 1; Sections—Graphite Nanoparticles, Mechanical Applications (Year: 2016).*
(Continued)

*Primary Examiner* — Hung Q Nguyen
*Assistant Examiner* — Anthony Donald Taylor, Jr.
(74) *Attorney, Agent, or Firm* — Fishman Stewart PLLC

(57) ABSTRACT

A sliding element may include a base material having an annular external surface upon which a bonding layer and a sliding layer are sequentially deposited. The sliding layer may be composed of hard amorphous carbon of a combined matrix with sp3/sp2 bonds. The sliding layer may include a plurality of nanoparticles of graphite incorporated within the combined matrix of sp3/sp2.

20 Claims, 3 Drawing Sheets

(51) Int. Cl.
*C23C 14/02* (2006.01)
*F16J 9/26* (2006.01)
*C23C 14/32* (2006.01)
*C23C 14/06* (2006.01)
*C23C 14/16* (2006.01)
*C23C 14/34* (2006.01)

(52) U.S. Cl.
CPC ...... *C23C 14/0605* (2013.01); *C23C 14/0635* (2013.01); *C23C 14/16* (2013.01); *C23C 14/325* (2013.01); *C23C 14/3407* (2013.01); *F16J 9/26* (2013.01)

(58) Field of Classification Search
USPC ........................................................ 123/193.4
See application file for complete search history.

(56) References Cited

U.S. PATENT DOCUMENTS

| | | | | |
|---|---|---|---|---|
| 7,406,940 | B2* | 8/2008 | Nishimura | C10M 145/08 |
| | | | | 123/193.2 |
| 7,771,821 | B2* | 8/2010 | Martin | C10M 169/04 |
| | | | | 428/408 |
| 9,086,148 | B2 | 7/2015 | Kennedy | |
| 9,103,015 | B2* | 8/2015 | Kennedy | C23C 14/0605 |
| 9,488,275 | B2* | 11/2016 | Ivanov | C23C 28/32 |
| 9,550,953 | B2 | 1/2017 | Avelar Araujo et al. | |
| 9,809,885 | B2* | 11/2017 | Hoppe | C23C 28/343 |
| 9,885,417 | B2* | 2/2018 | Sugimoto | F16J 9/26 |
| 10,077,839 | B2 | 9/2018 | Ooshiro et al. | |
| 2007/0224349 | A1* | 9/2007 | Hosenfeldt | C23C 14/024 |
| | | | | 427/249.1 |
| 2009/0001669 | A1* | 1/2009 | Hoppe | F16J 9/26 |
| | | | | 277/442 |
| 2012/0088093 | A1* | 4/2012 | Kennedy | C23C 16/303 |
| | | | | 428/323 |
| 2012/0177915 | A1* | 7/2012 | Kasai | C10M 141/10 |
| | | | | 428/336 |
| 2012/0248711 | A1* | 10/2012 | Iwashita | C23C 28/044 |
| | | | | 277/444 |
| 2013/0042845 | A1* | 2/2013 | Kennedy | C23C 28/044 |
| | | | | 123/668 |
| 2013/0140776 | A1* | 6/2013 | Kennedy | C23C 14/325 |
| | | | | 277/442 |
| 2014/0323368 | A1* | 10/2014 | Avelar Araujo | C23C 14/0641 |
| | | | | 508/105 |
| 2014/0353923 | A1* | 12/2014 | Lammers | C23C 28/42 |
| | | | | 277/443 |
| 2015/0362071 | A1 | 12/2015 | Ivanov et al. | |
| 2016/0003356 | A1* | 1/2016 | Ozaki | C23C 14/0605 |
| | | | | 277/443 |

FOREIGN PATENT DOCUMENTS

| | | | | |
|---|---|---|---|---|
| DE | WO2008000573 | * | 1/2008 | ............ C23C 14/06 |
| JP | WO2015121944 A1 | * | 8/2015 | ......... C23C 14/0036 |
| WO | 2015/121944 A1 | | 8/2015 | |

OTHER PUBLICATIONS

Ultrathin Diamond-like Carbon Films Deposited by Carbon Vacuum Arcs, Andre Anders, Jul. 13, 2001, pp. 3-4 (Year: 2001).*

Chu P K et al: Characterization of amorphous and nanocrystalline carbon fi 1 ms II • Materials Chemistry and Physics. Elsevier SA. Switzerland. Taiwan. Republic of China., vol. 96. No. 2-3. Apr. 10, 2006 (Apr. 10, 2006). pp. 253-277.

Coll B F et al: "Diamond-like carbon films synthesized by cathodic arc evaporation". Thin Solid FILMS. Elsevier. Amsterdam. NL., vo 1. 209. No. 2. Mar. 30, 1992 (Mar. 30, 1992). pp. 165-173.

Robertson J: "Diamond-like amorphous carbon", Materials Science and Engineering: R: Rep, Elsevier, Amsterdam, NL, vol. 37, No. 4-6, May 24, 2002 (May 24, 2002), pp. 129-281.

Chinese Office Action dated Oct. 21, 2019 for parallel Chinese Patent Application No. CN 201780037480.0.

Chinese Office Action dated May 13, 2020 for copending Chinese Application No. 201780037480.0.

Chinese Office Action dated Jan. 11, 2021 for copending Chinese Application No. 201780037480.0.

* cited by examiner

SLIDING ELEMENT FOR INTERNAL COMBUSTION ENGINES

CROSS-REFERENCE TO RELATED APPLICATIONS

This application claims priority to International Patent Application No. PCT/EP2017/065888, filed Jun. 27, 2017, and Brazilian Patent Application No. BR 10 2016 015392 1, filed on Jun. 30, 2016, the contents of both of which are hereby incorporated by reference in their entirety.

TECHNICAL FIELD

The present invention relates to a sliding element, such as a piston ring for internal combustion engines, having a coating of hard amorphous carbon comprising nanoparticles of a solid lubricant capable of bringing about a reduction in the friction and wear, together with diminishing the internal stresses generated in the application of the coating of hard amorphous carbon, in addition to ensuring high hardness.

BACKGROUND

Internal combustion engines, whether of Diesel cycle, Otto cycle, two or three stroke, comprise at least one piston ring. The piston ring acts in the sealing of the space between the cylinder liner and the body of the piston, isolating the combustion chamber from the other internal components of the engines. The piston ring is disposed radially upon the base of the body of the piston, preventing the combustion gases from escaping from the combustion chamber in the direction of the sump and preventing the engine oil from penetrating into the combustion chamber.

Normally, the engines have three rings located parallelly in grooves disposed in the base of the piston body, being two compression rings and one oil scraper ring. The compression rings are closer to the head of the piston and seal the clearance existing between piston and liner, rendering possible that the piston may compress the air-fuel mixture for the burning and subsequently maintain the hermeticity of the cylinder. The oil scraper rings have the obvious function of scraping the excess of lubricant oil thrown under pressure onto the wall of the liners.

Some internal combustion engines, principally engines operating with the Diesel cycle, work under high loads. Other examples may be found in high performance petrol engines. Independently of the examples which may be cited, there is a trend for the engines to operate at high speed and high power, reduced clearances and, consequently, subject to a severe tribological regime. Such conditions are naturally more exacting in terms of the mechanical components thereof. In this respect, the rings utilized in these engines of high power or performance require low friction, high hardness and high resistance to wear.

In addition, it is important to stress that the environmental impact of internal combustion engines, when taken together with the need for high performance and durability, results in a general manner in the need to work with tighter tolerances, this naturally being translated into the utilization of increasingly thin layers of lubricating oils.

In addition to being thinner, the layers of lubricating oils are also obtained by means of oils of low viscosity, ensuring lower friction between the sliding components. Nevertheless, the thinner the film of oil and lower the viscosity thereof the greater the probability of contact between the sliding components, rendering it necessary to improve the resistance to wear of these components in order that the seizure of the sliding assembly does not occur.

The seizure of the piston ring and cylinder liner assembly is a result of an increase in pressure between these sliding components to the point of the components coming into contact, leading to micromelts of the materials. The molten material will be transferred to the contact surface, generating a subsequent accumulation of material leading, eventually, to the seizure of the assembly. In this manner, as shall be seen hereinbelow, the present invention has been developed specifically offering a solution the excellent performance whereof flows from the utilization of predominantly less viscous oils.

In general, the application of layers of coating upon rings for engines working under high loading is realized through processes of deposition of vapor, especially physical vapor deposition (PVD), and of plasma assisted chemical vapor deposition (PACVD). Heavy duty Diesel engines were the first to utilize chromium nitride (CrN) coating applied by cathodic arc deposition (Arc-PVD). In recent years, the coatings applied by PVD have also come to be utilized upon piston rings for light duty engines, both petrol and Diesel, by virtue of the excellent resistance to wear and to seizure, ensuring durability.

The piston rings presented in the state of the art generally comprise coatings of hard amorphous carbon, also known as diamond like carbon (DLC) or hydrogen free hydrogenated DLC nanostructure, as a solution to achieve low friction and high resistance to wear. In general, the solutions of the state of the art apply the coating of DLC in a composition incorporating $sp^3$ (diamond type) and $sp^2$ (graphite type) bonds. Nevertheless, it should be noted that, by virtue of the tridimensional (3D) structure of the $sp^3$ bonds, the hardness thereof exceeds that encountered in the $sp^2$ bonds.

For a better understanding, the $sp^2$ structures, by virtue of conferring characteristics of an extremely soft and lubricant material, are important to facilitate the bedding in of the ring within the cylinder liner and counterbalance the $sp^3$ structures in contact with the cylinder liner. Such concern is extremely valid by virtue of the fact that, in addition to the $sp^3$ structure possibly scoring the cylinder liner, the concentration of stresses present in the $sp^3$ structures is very high such that it may generate disastrous consequences for both the cylinder liner, scoring it, and for the coating, rendering the possibility of the occurrence of cracks and the propagation thereof, consequently leading to the diminution of the working life of the components. For such reason diverse solutions of the state of the art utilize DLC coatings having a predominance of $sp^2$ bonds, having the objective of reducing the friction and internal stresses.

The document US 2015362071 describes a sliding element, particularly a piston ring, having a DLC coating whereupon are deposited, sequentially, a first layer of hard DLC, a second layer of soft DLC, and a third layer of hard DLC. It should be noted that the high internal stresses inherent to the deposition of a DLC coating result in the necessity of finding solutions such as those of this document. Nevertheless, even on reducing the residual stress, this solution does not fully resolve the problem by virtue of the fact that the interface of contact of the ring with the liner continues to take place by means of a profile which does not ensure, for example, that the cylinder liner does not experience the typical wear of the solutions of the state of the art.

In another example, the patent document U.S. Pat. No. 9,086,148 divulges a sliding element, particularly a piston ring, having a DLC coating of the ta-C type having a thickness exceeding 10 micrometers, wherein the coating contains a finishing layer having a thickness from 1 to 3 micrometers, wherein the quantity of $sp^a$ diminishes to values of less than 40% having a view to ensuring the presence of a greater quantity of $sp^2$ in this second layer for bedding in the ring within the cylinder.

Independently of the efforts revealed by the documents of the prior art, a solution generating excellent results in the finished product has still not been found, that is to say a piston ring bringing about a reduction in the friction and consequential reduction in the wear, diminishing internal stresses, whilst ensuring high hardness and durability of the ring.

In this manner it is rendered necessary to find a sliding element, such as a piston ring having a coating of hard amorphous carbon comprising a lubricant incorporated within the coating such as to bring about a reduction of the friction together with diminishing the wear, ensuring high hardness.

SUMMARY

A first object of the present invention is to provide a sliding element, such as a piston ring for internal combustion engines, particularly engines operating under heavy load and/or power, the ring having a coating of hard amorphous carbon comprising nanoparticles of solid lubricant incorporated within the matrix of the coating capable of bringing about a reduction in the friction and consequential reduction in the wear both of the piston ring and of the cylinder liner.

And, also, an object of the present invention is to provide a piston ring having a coating capable of working with very close clearances and a minimum film of oil.

And, finally, an object of the present invention is to provide a piston ring having a coating capable of ensuring high hardness, in the band from 20 GPa to 50 GPa, having lower internal stresses and high durability of the ring.

The objects of the present invention are achieved by a sliding element for internal combustion engines comprising a base material having an annular external surface whereupon are deposited, sequentially, a bonding layer and a sliding layer composed of hard amorphous carbon (DLC) of a combined matrix having $sp^3/sp^2$ bonds, the sliding layer comprising nanoparticles of graphite incorporated within the combined $sp^3/sp^2$ matrix.

The objects of the present invention are, also, achieved by a method for coating a sliding element for internal combustion engines making use of a process of physical vapor deposition (PVD) by cathodic arc realized under a pressure condition of between 0.01 mbar and 0.2 mbar, a cathode current of between 40 A and 100 A, a flow of argon gas of between 50 sccm and 200 sccm, a polarization voltage of between 30V and 45V and with temperature ranging between 150° C. and 240° C.

The objects of the present invention are, furthermore, achieved by an internal combustion engine comprising at least one sliding element.

BRIEF DESCRIPTION OF THE DRAWINGS

The present invention shall, hereinafter, be described in greater detail on the basis of an example of embodiment represented in the drawings. The figures show.

DETAILED DESCRIPTION OF THE DRAWINGS

The present invention relates to a sliding element, such a piston ring for internal combustion engines, having a coating of hard amorphous carbon comprising nanoparticles of a solid lubricant capable of bringing about a reduction in the friction and, consequently, reducing the wear upon the sliding face of the ring, together with diminishing the internal stresses generated in the application of the coating of hard amorphous carbon, in addition to ensuring high hardness.

In an alternative preferential configuration, the sliding element of the present invention may be an engine component maintaining contact with a thin layer of lubricating fluid, experiencing wear, such as for example, inter alia, a cylinder liner, an oil scraper piston ring, a first groove piston ring.

Figure 1:
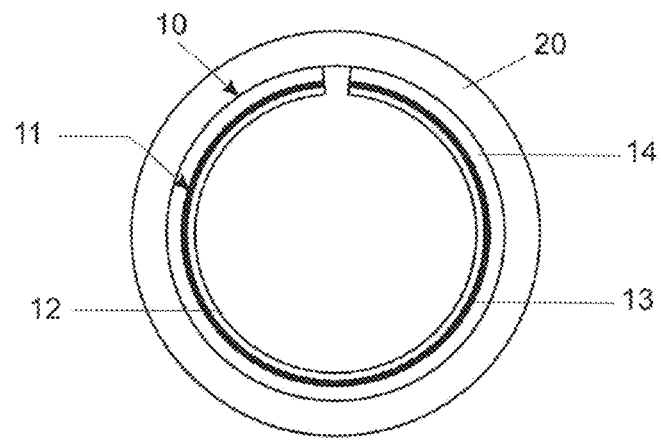
FIG. 1: a representation of the disposition of a piston ring within the interior of a cylinder of an internal combustion engine.

Initially, it should be noted that the sliding element of the present invention is preferentially a piston ring 10 for internal combustion engines operating under high load and/or power, as illustrated in FIG. 1. Usually these piston rings work with very close tolerances and a thin film of oil to ensure excellent performance and low emissions of $CO_2$.

The piston ring 10 of the present invention comprises a base material 12 having an external annular surface 11, being composed, preferentially, of stainless steel having 10% to 17% chromium, the balance being cast iron and carbon steel. The annular external surface 11 corresponds to the portion of the ring parallel to the liner of the cylinder 20, in other words it is the surface acting as interface between the ring and a cylinder liner 20, wherein it is upon the external surface 11 that the coating is deposited.

Figure 2:
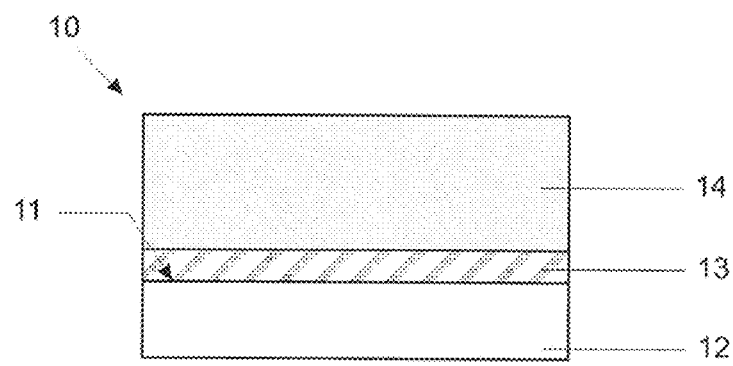
FIG. 2: a cross-section of the piston ring revealing the structure of the coating of the present invention.

In a preferential configuration, illustrated in FIG. 2, the external surface 11 receives, sequentially, a bonding layer 13 and, upon the bonding layer 13, a sliding layer 14 composed of hard amorphous carbon.

The bonding layer 13 has as objective to bring about the relief of the stresses between the metal structure of the ring and the sliding layer 14 of amorphous carbon, in this manner ensuring an excellent adhesion between the functional sliding layer 14 and the base material 12. In a preferential, however not obligatory, manner the bonding layer 13 is formed by a body centered cubic (bcc) polycrystalline columnar structure of metallic chromium (Cr), the thickness whereof ranges between 0.01 micrometers and 2.0 micrometers, preferentially 0.01 micrometers and 0.5 micrometers. In an alternative preferential configuration, the bonding layer 13 is composed of one from among the materials such as nickel (Ni), cobalt (Co), tungsten (W), chromium carbide (CrC) or by a ceramic material.

In its turn, the sliding layer 14 acts as an antifriction layer and is formed of hard amorphous carbon (DLC), the carbon being totally amorphous, free or substantially free of hydrogen, comprising less than 2% by weight of hydrogen.

Figure 2A:
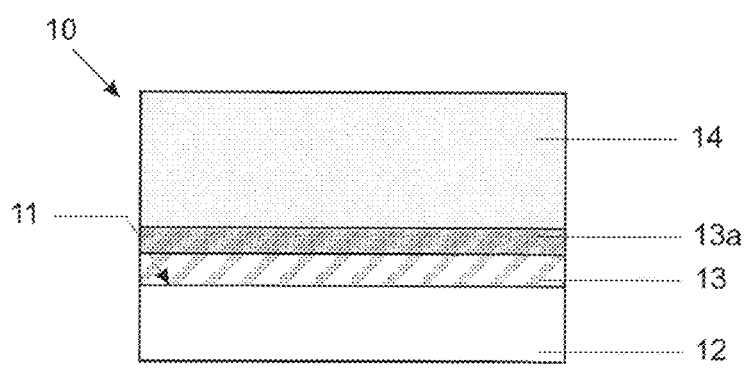
FIG. 2a: a cross-section of the piston ring revealing the structure of the coating of the present invention.

In an alternative preferential configuration, illustrated in FIG. 2a, the external surface 11 of the ring 10 receives, sequentially, a bonding layer 13, an intermediate layer 13a and a sliding layer 14. The intermediate layer 13a is composed of a ceramic material such as chromium nitride (CrN), or titanium nitride (TiN), or multilayers of chromium-aluminum nitride and chromium nitride (CrAlN/CrN). The intermediate layer 13a comprises a thickness ranging between 5 micrometers and 50 micrometers and is deposited by a process of physical vapor deposition (PVD).

In a manner differing from the solutions found in the state of the art, the present invention presents a sliding layer 14 of hard amorphous carbon comprising a matrix combining bonds of type $sp^3$ (diamond) and type $sp^2$ (graphite), wherein islands, or nanoparticles, of graphite are incorporated, revealing a nanostructure provided with islands of solid lubricant embedded within an $sp^3/sp^2$ matrix.

In this manner, the present invention has as object a piston ring 10 having a coating comprising a hardness ranging between 20 GPa and 50 GPa, preventing however high wear of the cylinder liner 20, the hardness whereof is considerably lower, by virtue of the reduction of the friction and of the wear of the sliding components through the rendering available of a flow of solid lubricant in the sliding layer 14.

In order to achieve the objects of the present invention, the sliding layer 14 of the piston ring 10 comprises islands, or nanoparticles, of graphite incorporated within the $sp^3/sp^2$ matrix capable of relieving and reducing internal stresses of the matrix, resulting in a sliding layer 14 having high resistance to wear, by virtue of the reduction of the friction, and high hardness with reduced internal stresses, preventing the spalling of the coating, in addition to rendering available a flow of lubricant in a thin film of oil, considerably diminishing the probability of seizure of the piston ring/cylinder liner assembly.

It is important to note that, when describing nanoparticles, particles of the order of nanometers are being considered, any particles having a size of less than 1000 nanometers being considered to be nanoparticles. Consequently, the present invention reveals islands, or nanoparticles, of graphite incorporated within an $sp^3/sp^2$ matrix of a DLC coating, the size of the nanoparticles of graphite ranging between 1 nanometer and 1000 nanometers, preferentially between 5 nanometers and 500 nanometers.

By virtue of the possibility of relief of internal stresses of the $sp^3/sp^2$ matrix of high hardness, the sliding layer 14 of DLC of the present invention comprises a thickness ranging between 1 micrometer and 50 micrometers. In a preferential configuration the thickness of the sliding layer ranges between 3 micrometers and 35 micrometers.

The new technologies of coating piston rings comprise the combination of the concepts of deposition by a process of physical vapor deposition based upon chromium nitride (CrN based PVD), the coating being composed of hydrogen free DLC hard amorphous carbon, wherein the thickness of the coating ranges between 1 and 50 micrometers, in accordance with application in light or heavy engines. These concepts combine advantages of the ceramic PVD and DLC coating, being capable of satisfying the requirement for low friction and high seizure resistance within a low cost solution utilizing a robust coating process. This combination furthermore permits the obtainment of a great thickness of coating having lower internal stresses, ensuring high durability of the ring with appropriate finish. The DLC coating is based upon hard amorphous carbon, being hydrogen free and having high resistance to wear, preventing the coating from experiencing incompatibilities with oil additives.

The present invention is based upon recent discoveries regarding the morphology and the microstructure of the DLC coating together with the new processes of deposition, ensuring a better adherence utilizing cathodic arc processes, and a bonding layer 13, or adherence layer, having a specific nanostructure. Furthermore, the process of optimized control of temperature diminishes the activation energy necessary to convert diamond into graphite and increases the kinetics of the reaction. These temperature controls have an impact upon the control of internal stresses and achieve better carbon bonds, as may be observed in FIG. 3.

Figure 3:
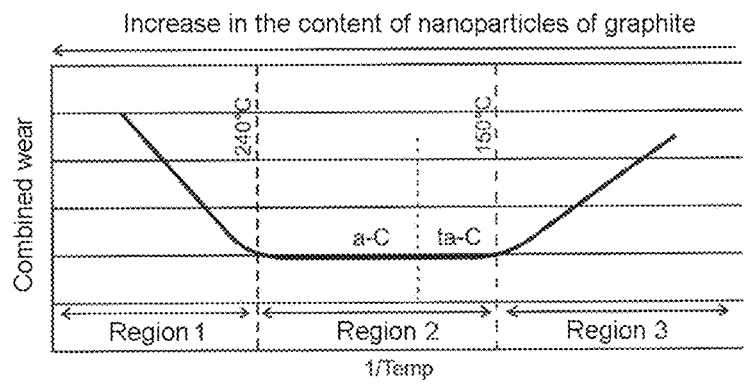
FIG. 3: a graphical representation of the tribological behavior of the coating of the present invention.

FIG. 3 presents a graph describing the tribological behavior of the coating of hydrogen free hard amorphous carbon of the present invention, having three different regions.

In region 1 there is a sliding layer 14 obtained by a PVD process realized at temperatures exceeding 240° C., great quantities of nanoparticles of graphite incorporated within the $sp^3/sp^2$ matrix being obtained. Consequently, the coating obtained in region 1 presents characteristics of a soft material with reduction of friction which, however, experiences high wear in the contact between the annular external surface 11 of the base material 12 of the piston ring 10 and the cylinder liner 20. In this respect the coating presents reduced resistance to wear at temperatures exceeding 240° C.

In contrast, in region 3 of the graph there is a DLC sliding layer 14 obtained by a PVD process realized at temperatures below 150° C., small quantities of nanoparticles of graphite incorporated within the $sp^3/sp^2$ matrix being obtained. Consequently, the coating obtained in region 3 presents high hardness, having however high internal stresses which, eventually, cause the fragmentation or spalling of the coating.

In region 2 there is the sliding layer 14 obtained by a PVD process realized at temperatures ranging between 150° C. and 240° C., capable of bringing about the development of nanoparticles of graphite incorporated within a matrix combining $sp^3/sp^2$ bonds. The coating obtained in region 2 is capable of bringing about a reduction in the friction, with consequent reduction in the wear of the piston ring 10 in contact with a cylinder liner 20, in addition to ensuring high hardness, having lower internal stresses for high durability of the ring.

The transition between the functional regions of the sliding layer 14 is governed, principally, by the temperature at the surface of the substrate whereupon the coating is synthesized. Coatings of hydrogen free hard amorphous carbon are, typically, produced by evaporation of graphite through a process of physical vapor deposition by cathodic arc. The temperature of the substrate is governed, in general, by the electrical energy applied for evaporation of graphite. In other words, the greater the power applied, the greater the evaporation and the greater the temperature of the substrate.

Another important phenomenon, also dependent upon the electrical energy applied in the process, is the generation of particles upon the DLC coating. Due to the energetic reaction, a certain quantity of unevaporated material is ejected from the target and incorporated within the $sp^3/sp^2$ matrix of the sliding layer 14 in a structure of graphite, generating islands of graphite ($sp^2$). These islands of graphite may be understood as being nanoparticles of graphite having a structure of $sp^2$ bonding, differing from the structure of the matrix. It is essential to emphasize that, the greater the evaporation from the surface of the target, the greater will be the quantity of molten material ejected from the surface of the target, in this manner increasing the generation of islands of sp² graphite in the sliding layer 14.

It should be noted that a DLC coating having a predominance of sp$^a$ bonds is desirable by virtue of the high hardness which the coating may attain, achieving values exceeding 40 GPa. On the other hand, coatings of high hardness represent lower wear upon the coated face, significantly increasing the combined wear between the piston ring 10 and the cylinder liner 20 by virtue of more aggressive working conditions for the cylinder liners 20. A further disadvantage of extremely hard coatings arises from the thickness of the coating which must be limited to a few micrometers, considerably diminishing the durability of the coated face. The greater the thickness of the hard coating, the greater the internal stresses of the material, generating the spalling of the coating during the operation of the engine. Spalling may be understood to be a process wherein fragments of coating debond from the base material 12 of the ring due to working impacts or pressures.

Diversely, coatings having sp² bonds are very soft and excellent solid lubricants. As a consequence, the correct balance between hardness, brought about by the sp$^a$ bonds, and lubrication, brought about by the sp² bonds and by the nanoparticles of graphite incorporated within the sp$^a$/sp² matrix, is capable of achieving an ideal tribological performance, principally for piston rings working under critical operational conditions with high wear, requiring excellent hardness and lubrication.

In this critical state, the coating must provide good mechanical strength, a characteristic which cannot be achieved when a high content of graphite exists in the structure of the coating. This condition is capable of explaining the behavior of the coating in region 1 of the graphic of FIG. 3, wherein when the temperature of the substrate increases great quantities of islands, or nanoparticles, of graphite are generated.

Preferentially, the coating of the present invention is deposited upon the external surface 11 of the ring by a process of physical vapor deposition by cathodic arc occurring under a condition of pressure ranging between 0.01 mbar and 0.2 mbar, preferentially of 0.0022 mbar, with a cathode current of between 40 A and 100 A, preferentially of 80 A, a flow of argon gas of between 50 sccm and 200 sccm, preferentially of 100 sccm, and at a polarization voltage ranging between 30 V and 45V, preferentially of 40 V, with a variable temperature of deposition during the process comprising temperatures ranging between 150° C. and 240° C.

The temperature of the process is controlled by the time wherein the current from the cathode remains connected. The duty cycle parameter, or working cycle, represents the percentage of time wherein the current remains connected. The greater the average temperature desired the longer the duty cycle. In this manner, in table 1 hereinbelow the temperatures attained may be observed in the process in accordance with the duty cycle:

TABLE 1

| Temperature (° C.) | Duty Cycle (%) | Time connected (min) | Time disconnected (min) |
|---|---|---|---|
| 160 | 18 | 4 | 18 |
| 180 | 21 | 4 | 15 |
| 200 | 26 | 5 | 14 |
| 210 | 31 | 5 | 11 |
| 220 | 34 | 5 | 10 |
| 240 | 42 | 6 | 8 |

Figure 4:
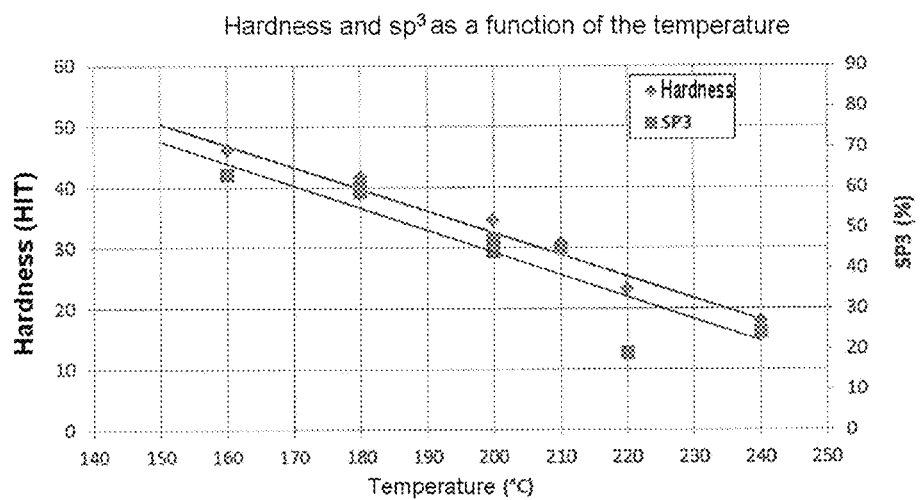
FIG. 4: a graphical representation of the hardness of the coating of the present invention and of the percentage of $sp^3$ bonds as a function of the temperature of the PVD process.

FIG. 4 shows two graphs representing the trends of hardness obtained and percentage of sp³ bonds for the coating of the present invention as a function of the temperature of the PVD process utilized.

Consequently, observing FIG. 4 it may be seen that for a process temperature of 150° C. there is obtained a coating having an effective microhardness of at least 50 GPa (HIT hardness) having a percentage of sp³ bonds ranging between 60% and 70%. For a temperature of 200° C. there is obtained a coating having a hardness ranging between 30 GPa and 35 GPa with a percentage of sp³ bonds ranging between 40% and 50%. Furthermore, for a temperature of 240° C. there is obtained a softer coating having a hardness of less than 30 GPa and a percentage of sp³ bonds ranging between 20% and 30% with predominant formation of sp² bonds (graphite), highly lubricant, however of extremely low hardness.

Although the sliding layer 14, described in the present invention, is formed solely from carbon, the new technology of coating proposed differs from any other found in the state of the art by virtue of the fact that it reveals a sliding layer 14 of hard amorphous carbon comprising islands, or nanoparticles, of graphite incorporated within an sp³/sp² matrix, capable of providing high hardness with reduction of friction under severe working conditions.

Figure 5:
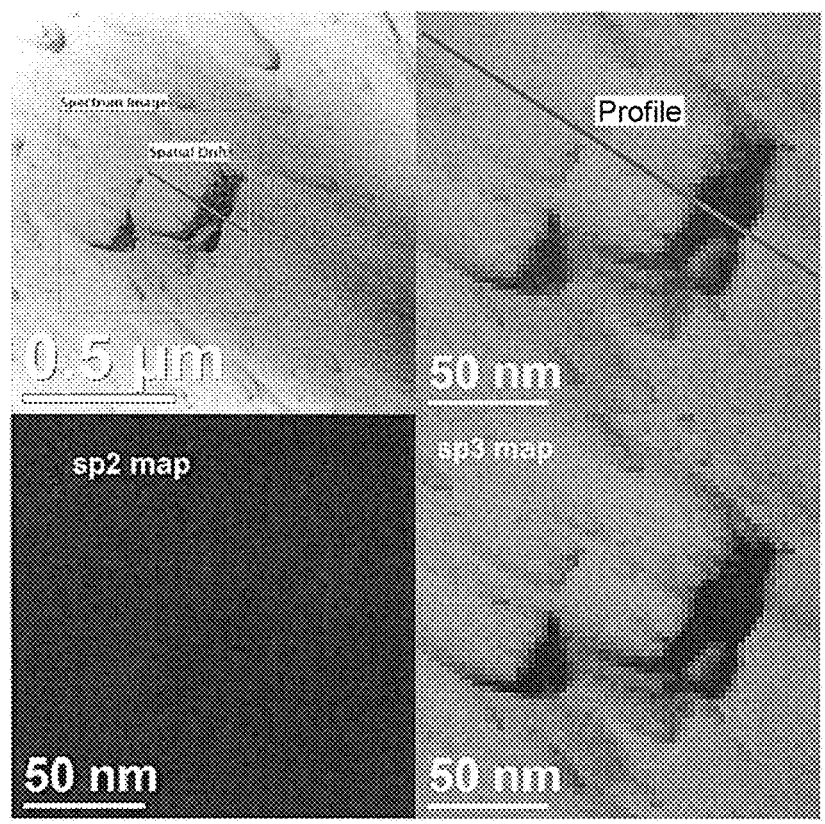
FIG. 5: maps obtained by EELS revealing the distribution of $sp^3$ and $sp^2$ bonds in the structure of the coating of the present invention.

The images shown in FIG. 5 are able to prove the existence of islands of graphite embedded or incorporated within a matrix combining sp³/sp² bonds within the sliding layer 14 of the present invention. In this respect, FIG. 5 shows maps obtained by electron energy loss spectroscopy (EELS) in STEM mode revealing the distribution of sp³ and sp² bonds within the sliding layer 14. Four maps are shown in this figure, as follows:

i. The first map, shown in the upper left corner, presents a photograph of the coating having a resolution of 0.5 micrometers, wherein there may be observed the islands of graphite incorporated within the sp³/sp² matrix. One island of graphite, particularly larger than the other islands, was selected for the purpose of illustration of the profile of distribution of sp³ and sp² bonds composing the sliding layer 14.

ii. The second map, shown in the upper right corner, presents a photograph of the coating having a resolution of 50 nanometers, detailing the profile illustrated for studying the sp³/sp² bonds.

iii. The third map, shown in the left lower corner, presents a photograph of the coating at a resolution of 50 nanometers, wherein the sp² bonds are highlighted. In this map it is possible to observe all the sp² bonds (graphite) in blue.

iv. The fourth map, shown in the right lower corner, presents a photograph of the coating at a resolution of 50 nanometers, wherein the sp³ bonds are highlighted. In this map it is possible to observe all the sp³ bonds (diamond) in green.

The profile illustrated, shown in the first and second maps, crosses an island of graphite. The percentage of the types of bonds (sp³ and sp²) found along a line of EELS analysis in the direction of growth of the coating is shown graphically in FIG. 6. Consequently, on observing FIGS. 5 and 6 together, it will be seen that the profile line crosses a large green portion having a predominance of sp³ bonds, ranging between 55% and 65% of sp³ bonds (diamond) and ranging between 35% and 45% of sp² bonds. On crossing the blue portion, the profile of material of the coating changes radically, presenting a predominance of sp² bonds, ranging between 65% and 70% of sp² bonds (graphite) and ranging between 30% and 35% of sp³ bonds. Subsequently, the profile again crosses a green portion wherein again there is a predominance of sp$^3$ bonds (diamond).

Figure 6:
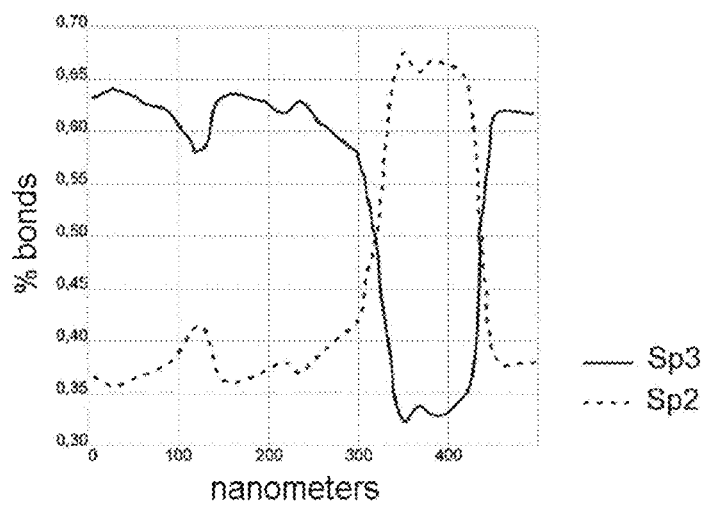
FIG. 6: a graphical representation of the profile of distribution of $sp^3$ and $sp^2$ bonds in the structure of the coating of the present invention.

Consequently, by means of FIGS. 5 and 6 it is possible to clearly observe the presence of islands of graphite (sp$^2$) incorporated within an sp$^3$/sp$^2$ matrix, rich in sp$^3$. It should be noted that the islands of graphite incorporated within the sp$^3$/sp$^2$ matrix of the sliding layer 14 comprise sizes of the order of nanometers and, for this reason, are referred to as nanoparticles of graphite.

The coating of the piston ring 10 of the present invention acts such that, in the wear of the sliding layer 14, the nanoparticles of graphite become exposed, rendering solid lubricant available for the sliding between the ring and the cylinder liner 20. In this manner, the sliding layer 14 does not wear immediately, by virtue of the fact that the sp$^3$/sp$^2$ matrix comprises high hardness with nanometric particles of lubricant graphite which, in addition to bringing about a reduction in the friction, reduce the internal stresses of the hard sp$^3$/sp$^2$ matrix.

In summary, the piston ring 10 of the present invention is capable of rendering possible a coating of hard amorphous carbon substantially free of hydrogen comprising a matrix of high hardness with nanoparticles of solid lubricant capable of relieving and reducing internal stresses of the matrix of high hardness, preventing the spalling of the coating, in addition to making available a flow of lubricant capable of bringing about a reduction in the friction and, consequently, an increase in the resistance to wear of the ring, preventing the seizure of the sliding components and ensuring excellent durability.

An example of preferred embodiment having been described, it shall be understood that the scope of the present invention covers other possible variations, being limited solely by the content of the claims appended, included therein the possible equivalents.

The invention claimed is:

1. A sliding element for an internal combustion engine, the sliding element comprising a base material having an annular external surface upon which a bonding layer and a sliding layer are sequentially deposited, the sliding layer composed of hard amorphous carbon of a combined matrix of sp3/sp2 bonds, wherein:
the sliding layer includes a plurality of nanoparticles of graphite incorporated within the combined matrix of sp3/sp2 bonds;
the sliding layer includes a first depth region, a second depth region, and a third depth region disposed sequentially one after the other;
the first depth region includes a prominence of sp3 bonds;
the second depth region includes a prominence of sp2 bonds; and
the third depth region includes a prominence of sp3 bonds.

2. The sliding element as claimed in claim 1, wherein a size of the plurality of nanoparticles of graphite is from 1 nanometer to 1000 nanometers.

3. The sliding element as claimed in claim 1, wherein a size of the plurality of nanoparticles of graphite is from 5 nanometers to 500 nanometers.

4. The sliding element as claimed in claim 1, wherein the bonding layer is composed of at least one of metallic chromium having a body centered cubic structure, nickel, cobalt, tungsten, and chromium carbide.

5. The sliding element as claimed in claim 1, further comprising an intermediate layer disposed between the bonding layer and the sliding layer, wherein the intermediate layer is composed of a ceramic material.

6. The sliding element as claimed in claim 5, wherein the intermediate layer has a thickness from 5 micrometers to 50 micrometers.

7. The sliding element as claimed in claim 5, wherein:
the bonding layer is a PVD-deposited bonding layer; and
the intermediate layer is a PVD-deposited intermediate layer.

8. The sliding element as claimed in claim 1, wherein the sliding layer is composed of less than 2% by weight of hydrogen.

9. The sliding element as claimed in claim 1, wherein the sliding layer has a thickness from 1 micrometer to 50 micrometers.

10. The sliding element as claimed in claim 1, wherein the sliding layer has a thickness from 3 micrometers to 35 micrometers.

11. The sliding element as claimed in claim 1, wherein the sliding layer has a hardness from 20 GPa to 50 GPa.

12. The sliding element as claimed in claim 1, wherein the base material is composed of stainless steel having from 10% to 17% of at least one of chromium, cast iron, and carbon steel.

13. The sliding element as claimed in claim 1, wherein the sliding element is a piston ring.

14. A method for coating a sliding element for an internal combustion engine, the method comprising:
applying a bonding layer on an annular external surface of a base material;
forming a sliding layer on the bonding layer via physical vapor deposition by cathodic arc;
wherein the sliding layer is composed of hard amorphous carbon of a combined matrix of sp3/sp2 bonds;
wherein forming the sliding layer includes incorporating a plurality of nanoparticles of graphite within the combined matrix of sp3/sp2 bonds; and
wherein forming the sliding layer further includes forming a first depth region, a second depth region, and a third depth region disposed sequentially one after the other, the first depth region including a prominence of sp3 bonds, the second depth region including a prominence of sp2 bonds, and the third depth region including a prominence of sp3 bonds.

15. An internal combustion engine, comprising at least one sliding element including a base material having an annular external surface upon which a bonding layer and a sliding layer are sequentially deposited, the sliding layer composed of hard amorphous carbon of a combined matrix of sp3/sp2 bonds, wherein:
the sliding layer includes a plurality of nanoparticles of graphite incorporated within the combined matrix of sp3/sp2 bonds;
the sliding layer is substantially free of hydrogen;
the sliding layer includes a first depth region, a second depth region, and a third depth region disposed sequentially one after the other;
the first depth region includes a prominence of sp3 bonds;
the second depth region includes a prominence of sp2 bonds; and
the third depth region includes a prominence of sp3 bonds.

16. The sliding element as claimed in claim 1, wherein the plurality of nanoparticles of graphite have a structure of sp2 bonding that is different from that of the combined matrix of sp3/sp2 bonds.

17. The sliding element as claimed in claim 1, wherein:
the bonding layer has a body centered cubic polycrystalline columnar structure of metallic chromium; and the bonding layer has a thickness of 0.01 micrometers to 0.5 micrometers.

18. The sliding element as claimed in claim 1, wherein:
the first depth region extends to a depth of 320 nanometers and includes 55% to 65% sp3 bonds;
the second depth region extends from the depth of 320 nanometers to 430 nanometers and includes 65% to 70% sp2 bonds; and
the third depth region begins at the depth of 430 nanometers and includes 60% to 65% sp3 bonds.

19. The sliding element as claimed in claim 1, wherein a greater quantity of the plurality of nanoparticles of graphite are present in the second depth region than in the first depth region and the third depth region.

20. The method of claim 14, wherein forming the sliding layer on the bonding layer via physical vapor deposition by cathodic arc is performed under a condition of pressure from 0.01 mbar to 0.2 mbar, with a cathode current of 40 A to 100 A, a flow of an argon gas from 50 sccm to 200 sccm, a polarization voltage from 30 V to 45 V, and a temperature from 150° C. to 240° C.

* * * * *